United States Patent
Lin et al.

(10) Patent No.: US 9,099,489 B2
(45) Date of Patent: Aug. 4, 2015

(54) BIPOLAR TRANSISTOR WITH HIGH BREAKDOWN VOLTAGE

(75) Inventors: Xin Lin, Phoenix, AZ (US); Daniel J. Blomberg, Chandler, AZ (US); Jiang-Kai Zuo, Chandler, AZ (US)

(73) Assignee: FREESCALE SEMICONDUCTOR INC., Austin, TX (US)

( * ) Notice: Subject to any disclaimer, the term of this patent is extended or adjusted under 35 U.S.C. 154(b) by 355 days.

(21) Appl. No.: 13/545,746

(22) Filed: Jul. 10, 2012

(65) Prior Publication Data

US 2014/0015090 A1 Jan. 16, 2014

(51) Int. Cl.
*H01L 29/02* (2006.01)
*H01L 21/02* (2006.01)
*H01L 29/66* (2006.01)
*H01L 29/732* (2006.01)
H01L 29/06 (2006.01)
H01L 29/417 (2006.01)
H01L 29/08 (2006.01)

(52) U.S. Cl.
CPC ...... *H01L 29/66272* (2013.01); *H01L 29/0821* (2013.01); *H01L 29/732* (2013.01); *H01L 29/063* (2013.01); *H01L 29/0607* (2013.01); *H01L 29/0808* (2013.01); *H01L 29/41708* (2013.01)

(58) Field of Classification Search
CPC ............. H01L 29/063; H01L 29/0821; H01L 29/41708; H01L 29/0607; H01L 29/0808
USPC ................................. 257/583, 495
See application file for complete search history.

(56) References Cited

U.S. PATENT DOCUMENTS

| 4,398,962 | A | 8/1983 | Kanazawa | |
|---|---|---|---|---|
| 4,536,945 | A | 8/1985 | Gray et al. | |
| 4,987,089 | A | 1/1991 | Roberts | |
| 5,374,845 | A | 12/1994 | Havemann | |
| 6,724,066 | B2 | 4/2004 | Swanson et al. | |
| 7,375,410 | B2 | 5/2008 | Ho et al. | |
| 7,495,312 | B2 | 2/2009 | Algotsson et al. | |
| 8,198,683 | B2 | 6/2012 | Konuma et al. | |
| 2006/0043417 | A1* | 3/2006 | Terashima | 257/197 |
| 2006/0091497 | A1* | 5/2006 | Sato | 257/575 |
| 2012/0098096 | A1* | 4/2012 | Lin et al. | 257/565 |

OTHER PUBLICATIONS

USPTO, Non-Final Office Action for U.S. Appl. No. 12/909,632, mailed Apr. 18, 2013.

(Continued)

*Primary Examiner* — Ha Tran T Nguyen
*Assistant Examiner* — Aaron Dehne
(74) *Attorney, Agent, or Firm* — Ingrassia Fisher & Lorenz, P.C.

(57) ABSTRACT

A higher breakdown voltage transistor has separated emitter, base contact, and collector contact. Underlying the emitter and the base contact are, respectively, first and second base portions of a first conductivity type. Underlying and coupled to the collector contact is a collector region of a second, opposite, conductivity type, having a central portion extending laterally toward, underneath, or beyond the base contact and separated therefrom by the second base portion. A floating collector region of the same conductivity type as the collector region underlies and is separated from the emitter by the first base portion. The collector and floating collector regions are separated by a part of the semiconductor (SC) region in which the base is formed. A further part of the SC region in which the base is formed, laterally bounds or encloses the collector region.

20 Claims, 8 Drawing Sheets

(56) References Cited

OTHER PUBLICATIONS

USPTO, Notice of Allowance and Fee(s) Due for U.S. Appl. No. 12/909,632, mailed Apr. 11, 2014.

USPTO, Final Office Action for U.S. Appl. No. 12/909,632, mailed Oct. 10, 2013.

USPTO, Response to Final Office Action for U.S. Appl. No. 12/909,632, mailed Dec. 10, 2013.

* cited by examiner

BIPOLAR TRANSISTOR WITH HIGH BREAKDOWN VOLTAGE

FIELD OF THE INVENTION

The present invention generally relates to semiconductor devices and circuits and methods for fabricating semiconductor devices and circuits, and more particularly relates to semiconductor devices and circuits embodying bipolar transistors.

BACKGROUND OF THE INVENTION

Bipolar transistors are much used in modern electronics as individual devices and as part of various integrated circuits (ICs). Particularly demanding applications of bipolar transistors occur in the automotive and aircraft fields where, among other things, relatively high breakdown voltages are desired for both grounded and high-side (non-grounded) applications. A further complication can occur when such bipolar transistors are manufactured at the same time and often on the same substrate as field effect transistors (FETs), such as metal-oxide-semiconductor (MOS) devices and/or complementary bipolar-MOS (Bi-CMOS) devices as part of an IC.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

Figure 1:
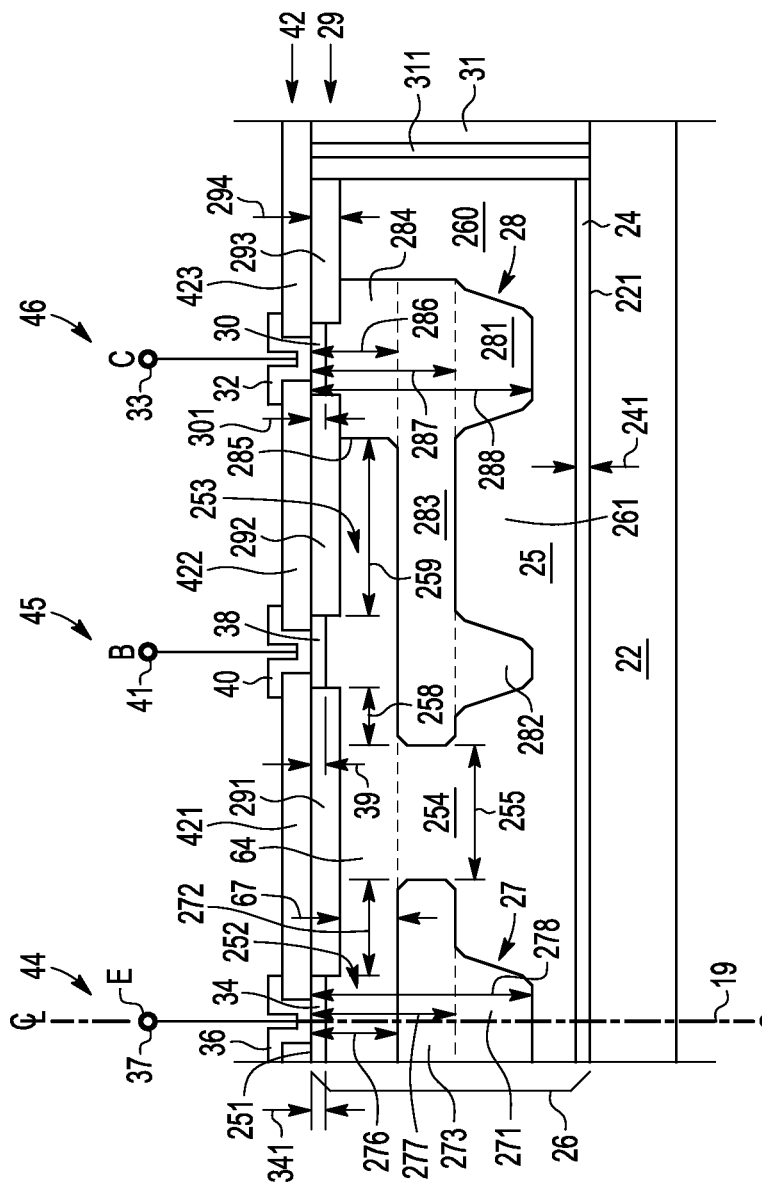
FIG. 1 shows a simplified cross-sectional view about a centerline of an improved bipolar transistor according to an embodiment of the invention.

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements or steps and not necessarily for describing a particular sequential or chronological order. It is to be understood that the terms so used are interchangeable under appropriate circumstances such that the embodiments of the invention described herein are, for example, capable of operation or arrangement in sequences other than those illustrated or otherwise described herein. Furthermore, the terms "comprise," "include," "have" and any variations thereof, are intended to cover non-exclusive inclusions, such that a process, method, article, or apparatus that comprises a list of elements or steps is not necessarily limited to those elements or steps, but may include other elements or steps not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose.

As used herein, the term "semiconductor" and the abbreviation "SC" are intended to include any semiconductor whether single crystal, poly-crystalline or amorphous and to include type IV semiconductors, non-type IV semiconductors, compound semiconductors as well as organic and inorganic semiconductors. Further, the terms "substrate", "semiconductor substrate" and "SC substrate" are intended to include single crystal structures, polycrystalline structures, amorphous structures, thin film structures, layered structures as for example and not intended to be limiting, semiconductor-on-insulator (SOI) structures, insulator on semiconductor (IOS) structures and combinations thereof. "High-side" capability refers to the situation where one seeks to employ transistors or other devices in configurations where the reference terminal of the transistor or other device is not at the ground or other common circuit reference potential, but at a higher voltage. Such situations are common in automotive and aircraft electronics applications.

For convenience of explanation and not intended to be limiting, semiconductor devices and methods of fabrication are described herein for silicon semiconductors, but persons of skill in the art will understand that other semiconductor materials may also be used. Additionally, various device types and/or doped SC regions may be identified as being of N type or P type, but this is merely for convenience of description and not intended to be limiting, and such identification may be replaced by the more general description of being of a "first conductivity type" or a "second, opposite conductivity type" where the first type may be either N or P type and the second type is then either P or N type. Various embodiments of the invention will be illustrated for NPN bipolar transistors but, again, this is merely for convenience of description and is not intended to be limiting. Persons of skill in the art will understand that PNP transistors and other semiconductor devices and circuits embodying either or both NPN and PNP combinations may be provided by appropriate interchange of conductivity types in the various regions.

A need continues to exist for improved high voltage bipolar transistors and methods for manufacturing the same, especially in connection with ICs that may employ other types of devices. It has been discovered that high breakdown voltage, bipolar transistors with significant high-side capability can be provided by including a floating collector region in conjunction with other device modifications. FIG. 1 shows a simplified cross-sectional view laterally from centerline 19 of improved bipolar transistor 20, according to an embodiment of the invention. Transistor 20 comprises substrate 22 of, for example, silicon semiconductor, having upper surface 221. Substrate 22 serves conveniently as a support or "handle" wafer for transistor 20. While semiconductor (e.g., silicon)

wafers are convenient for substrate 22, any type of material (e.g., insulator, semiconductor, conductor or combinations thereof) adapted to withstand the manufacturing process for transistor 20, may also be used. Insulating dielectric layer 24 of thickness 241 conveniently but overlies surface 221 of substrate 22 but may be omitted in other embodiments. Overlying dielectric layer 24 is semiconductor (SC) region or layer 25 in and on which transistor 20 is formed. SC region 25 has upper surface 251. As indicated by bracket 26, the combination of SC region 25 and underlying dielectric or insulating layer 24 is also referred to as semiconductor-on-insulator (SOI) structure 26. Substrate 22 serves as a "handle" for SOI structure 26. Such structures are much used in connection with automotive, aircraft and other application where high-side capability is desired, but embodiments of the invention may also be used in non-high-side applications and/or without insulating layer 24.

For an NPN transistor, SC region 25 in which transistor 20 is formed may be P type. In the embodiment of FIG. 1, spaced-apart shallow trench isolation (STI) regions 291, 292, 293 (collectively 29) of approximately similar thickness 294, and deep trench isolation (DTI) region 31 are located within SC region 25 proximate or extending to upper surface 251. STI regions 29 are also referred to as more generally as lateral dielectric structures 29. DTI region 31 desirably has doped poly central core 311, which may be omitted in other embodiments. Such isolation regions are conventional. Located within SC region 25 are spaced apart doped regions 27, 28 of the same conductivity type (e.g., N-type). Portions of SC region 25 laterally enclose and underlie both doped regions 27 and 28. Reference number 261 identifies that portion of SC region 25 that underlies doped regions 27 and 28, reference number 254 identifies that portion of SC region 25 that lies laterally between doped portions 273, 283 of regions 27 and 28, reference number 260 identifies that portion of SC region 25 that lies laterally to the right of doped region 28 and reference number 64 identifies that portion of SC region 25 that overlies doped regions 27 and 28 beneath surface 251 and/or beneath shallow trench isolation (STI) regions 291, 292. Portion 64 is also referred to herein as "base 64" and has leftward portion 252 and rightward portion 253. Where doped region 28 has a closed shape in plan view (e.g., around centerline 19), portion 260 laterally encloses doped region 28.

Doped region 28 serves as the collector of transistor 20 and is hereafter referred to as collector region 28. Collector region 28 has (e.g., N+) collector contact region 30 of thickness 301, desirably located proximate surface 251, but in other embodiments may be located elsewhere. Collector contact region 30 located in first part 46 of SC surface 251 is Ohmically coupled to doped region 28. Collector contact region 30 is also Ohmically coupled to collector electrode 32 and collector terminal 33. Doped region 27 is spaced apart from collector region 28 and is electrically floating with respect to collector region 28, that is, it has no Ohmic connection with collector region 28 even though regions 27 and 28 are located in common SC region 25. As is explained in more detail in connection with FIGS. 2-11 and 13-14, (e.g., N-type) doped regions 27 and 28 are conveniently formed at the same time and have similar doping profiles, but may be formed separately and/or have different doping profiles in other embodiments. As a convenient reminder that regions 27 and 28 have the same doping type and may be formed at the same time, doped region 27 is referred to herein as "floating collector region" 27 even though it has no direct connection with collector region 28. Stated another way, the terms "floating collector" and "floating collector region" 27 refer to a SC region of the same doping type as collector region 28, but physically separated therefrom and without Ohmic connection to collector region 28.

Laterally spaced apart from collector contact region 30 and collector electrode 32 is (e.g., N+) emitter region 34 of vertical thickness 341 located in third part 44 of SC surface 251, and having overlying emitter contact 36 and emitter terminal 37. Emitter region 34 is desirably, located proximate surface 251 of substrate 25, but may be located elsewhere in other embodiments. When formed at the same time, emitter region thickness 341 and collector contact region thickness 301 are substantially the same, but in other embodiments thicknesses 341, 301 may be different. Emitter region 34 overlies but is not in Ohmic contact with floating collector region 27. Emitter region (e.g., N+) 34 and (e.g., N-type) floating collector region 27 are separated by (e.g., P-type) leftward portion 252 of base region 64 of SC region 25. Portion 252 of SC region 25 forms part of the base of transistor 20. Emitter region 34 forms a (e.g., NP) junction with leftward portion 252 of (e.g., P-type) base region 64 of SC region 25. Floating collector region 27 lies at distance or depth 276 below surface 251 of SC region 25.

Located laterally between collector contact region 30 and emitter region 34 is base contact region 38 of vertical thickness 39 located in second part 45 of SC surface 251, and having base electrode 40 and base terminal 41. Base contact region 38 (e.g., P+) is in Ohmic contact with (e.g., P-type) leftward portion 252 and rightward portion 253 of base region 64 of SC region 25, and forms part of the base of transistor 20. As explained more fully in connection with FIGS. 2-11 and 13-14, base portions 252 and 253 are conveniently formed at the same time (e.g., as part of base region 64), and therefore may conveniently have similar doping, but in other embodiments they may have different doping levels and be formed in different manufacturing stages. In FIG. 1, emitter region 34 is laterally separated from base contact region 38 by first STI region 291, conveniently located proximate upper surface 251 of SC region 25. Similarly, base contact region 38 is laterally separated from collector contact region 30 by second STI region 292, also conveniently located proximate surface 251. Third STI region 293 extends to the right of collector contact region 30 and proximate DTI region 31. When transistor 20 has a closed shape in plan view (e.g., around centerline 19), a right half cross-section may have the configuration shown in FIG. 1 to the right of centerline 19 and a left half cross-section (not shown) may be a mirror image of FIG. 1 about centerline 19, but other closed and non-closed plan view shapes may be used in other embodiments.

Other features of transistor 20 illustrated in the embodiment of FIG. 1 are as follows. Collector region 28 has deeper portion 281 substantially underlying collector contact region 30 and deeper portion 282 substantially underlying base contact region 38. Deeper collector portions 281, 282 are coupled by vertically narrower approximately horizontally oriented central collector portion 283 that, in this embodiment, underlies collector contact region 30, base contact region 38 and part of STI regions 291, 292. Central collector portion 283 underlies base portion 253 and, in this embodiment, extends to the left of base contact region 38 by distance 258 and also somewhat to the left of deeper portion 282. Base portion 253 lies between collector portion 283 and (in this embodiment) STI region 291, 292 and base contact region 38, and extends to the right of base contact region 38 by distance 259, where it joins left edge 285 of wider upper portion 284 of collector region 28 overlying deeper portion 281. As a consequence of the way in which it is formed, upper portion 284 of collector region 28 is conveniently laterally somewhat wider than deeper portion 281, but may have other dimensions in other embodiment. The upper surface of central collector portion 283 is at depth 286 below surface 251. Depth 286 also identifies the thickness of upper collector portion 284. The lower surface of central collector portion 283 is at depth 287 below surface 251. The vertical thickness of central collector portion 283 is then the difference between dimensions or depths 286 and 287. The bottom surface of deeper collector portion 281 lies at depth 288 below surface 251, and also identifies the overall depth of collector region 28. Deeper collector portions 271, 281, 282 may be omitted in still other embodiments.

Floating collector region 27 has deeper portion 271 substantially underlying emitter region 34 and upper portion 273. Upper portion 273 overlies deeper portion 271 and is separated from first STI region 291 by leftward portion 252 of base region 64. Upper floating collector portion 273 lies at depth 276 below surface 251. Leftward base portion 252 lies between floating collector 27 and emitter region 34 and first STI region 291. When formed at the same time, base portions 252, 253 have similar thicknesses, but in other embodiments, the thickness of base portions 252, 253 may be different. Collector portion 283 and floating collector portion 273 extend toward each other and are separated by portion 254 of SC region 25. Portion 254 has lateral width 255. Portion 254 communicates with base 64 of transistor 20. Central portion 273 of floating collector region 27 is analogous to central portion 283 of collector region 28, and deeper portion 271 of floating collector region 27 is analogous to deeper portions 281, 282 of collector region 28. In floating collector 27, the upper surface of central portion 273 is at depth 276 below surface 251, the lower surface of central portion 273 is at depth 277 below surface 251, and the vertical thickness of central collector portion 273 is then the difference between depths 277 and 276. The bottom surface of deeper portion 271 lies at depth 278 below surface 251, and also identifies the overall depth of floating collector region 27. In the embodiment illustrated in FIG. 1, dielectric regions 421, 422, 423 (collectively 42) conveniently overlie STI regions 291, 292, 293 respectively and separate emitter, base and collector contacts 36, 40, 32, but such dielectric regions may be omitted in other embodiments.

A consequence of the above-described structure is that break-down voltage (BV) is improved. This occurs in part because (e.g., N-type) collector region 28 is substantially surrounded by various connected or continuous portions of S region 25, e.g., made up of (e.g., P-type) base portions or regions 253, 254, 260, 261 substantially above, alongside and below collector region 28. Rightward base portion 253 extends at least by distance 259 from base contact 38 toward upper collector portion 284. This contributes to collector region 28 being substantially surrounded by S communicating with base region 64. Collector region 28 is laterally substantially bounded or surrounded by portions 254, 260 of SC region 25, which regions are coupled to base portion 64 in other parts of SC region 25, e.g., to portions 64, 252, 253 and 261 having the same doping type.

Floating collector region 27 functions as an extended base when the collector voltage is low. However, when the collector voltage is high enough to deplete (e.g., P-type) region 254 between collector region 28 and floating collector region 27, floating collector region 27 functions electrically as a part of collector region 28. However, in this situation, the voltage on floating collector region 27 is significantly lower than the voltage on collector region 28. As the emitter bias rises, approaching BVebo, the potential of floating collector region 27 rises due to the complete depletion of leftward portion 252 of base region 64 beneath emitter region 34. This circumstance spreads out the equipotential lines between emitter region 34 and base region 64, resulting in high values of BVebo. The use of relatively thin rightward portion 253 of base region 64 extending laterally by distance 259 above collector portion 283 toward portion 284 of collector region 28. Also, surrounding (e.g., P-type) regions 254, 260 and 261 function as a RESURF (Reduced Surface Field) layer. Such RESURF layer helps drop the potential more evenly at BVcbo and BVceo, thereby yielding high breakdown voltages. This result is very desirable.

FIGS. 2-9 show simplified cross-sectional views of bipolar transistor 20 of FIG. 1 during various stages 802-809 of manufacture yielding structures 902-909. Unless otherwise specifically noted, the various masks described herein may be formed of photoresist, but other materials may also be used. Referring now to manufacturing stage 802 of FIG. 2, substrate 22 having upper surface 221 is provided on which has been formed insulating dielectric layer 24 of thickness 241. Overlying layer 24 is substantially homogenous SC region 25 of thickness 250 and having upper surface 251. As noted earlier, substrate 22 may be made of any material adapted to withstand the manufacturing process used to form transistor 20, and any associated circuit elements being formed at the same time, for example and not intended to be limiting, as part of an integrated circuit (IC). Silicon is a non-limiting example of a suitable material for "handle" substrate 22. The primary function of substrate 22 is to provide a robust and convenient platform on which transistor 20 and any associated circuitry or other devices may be formed. Silicon dioxide and sapphire are non-limiting examples of suitable materials for dielectric layer 24, but other insulating materials may also be used. Where dielectric layer 24 is of silicon oxide, thicknesses 241 is usefully in the range of at least about 0.05 micrometers, but other thicknesses may also be used. SC region 25 of thickness 250 is preferably formed by epitaxial growth, but other formation techniques may also be used in other embodiments. Epitaxial growth is preferred because of the possibility of obtaining substantially single crystal material for SC region 25, but other types of materials may be used in other embodiments. Thickness 250 will depend upon the particular transistor properties being sought and is within the competence of those of skill in the art. Thickness 250 in the range of about 0.5 to 15 micrometers is convenient, but other thicknesses may also be used. SC region 25 desirably has doping in the range of about 1E14 to 1E18 per $cm^3$, but higher or lower doping may also be used. For an NPN transistor, SC region 25 preferably has P-type doping of about 5E14 to 1E16 per $cm^3$, but higher and lower doping can be used in other embodiments, as well as other conductivity type for other types of transistors. The combination of dielectric layer 24 and SC region 25 is also referred to as semiconductor-on-insulator (SOI) structure 26. Structure 902 results from manufacturing stage 802. While SOI structure 26 is desirable, other arrangements may be used in other embodiments and SC region 25 may be part of or formed directly on substrate 22.

Figure 2:
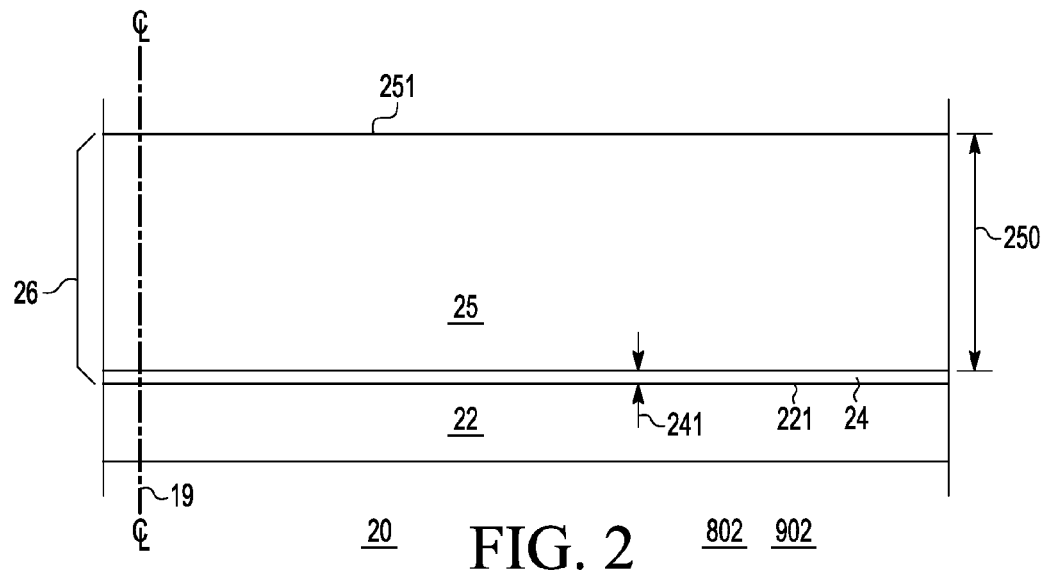
FIGS. 2-9 show simplified cross-sectional views of the bipolar transistor of FIG. 1 during various stages of manufacture according to still further embodiments of the invention.
Figure 3:
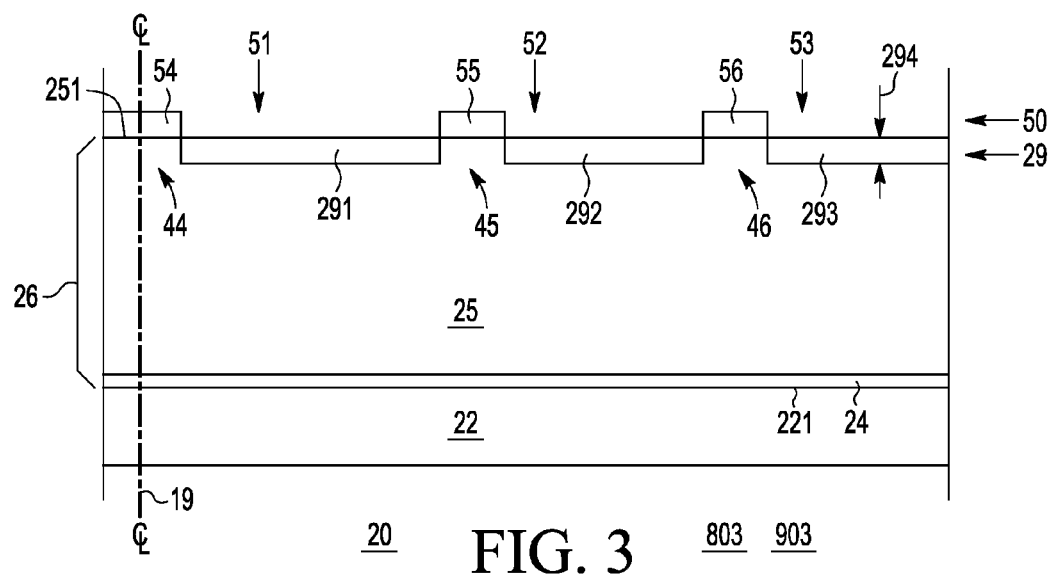

Referring now to manufacturing stage 803 of FIG. 3, mask 50 applied to surface 251 of structure 902 of FIG. 2. Mask 50 has open regions 51, 52, 53 corresponding in location and size substantially to the desired location and size of lateral dielectric structures, e.g., STI regions 291, 292, 293 (collectively 29), respectively. Mask 50 has intervening closed regions 54, 55, 56. Mask 50 is desirably of a material that resists etching of SC region 25 and any other processing that may be used to create STI regions 29 under openings 51, 52, 53 while protecting those portions of SC region 25 underlying closed portions 54, 55, 56. STI thickness 294 is conveniently in the range of about 0.2 to 0.8 micrometers, but thicker and thinner layers may also be used. While it is convenient to form STI regions 291, 292, 293 at the same time, in other embodiments they may be formed separately or in other combinations. Techniques for forming such STI regions are well known in the art. Openings 51,52, 53 are conveniently used to etch recesses into substrate 25 that are then filled, for example, with deposited silicon oxide to create STI regions 29. A planarization step may be used so that STI regions 29 have their upper surfaces substantially planar with surface 251 of SC region 25, but that may be omitted in other embodiments. Any convenient procedure for forming STI regions may be used. Referring also to FIG. 1, the lateral gap between STI regions 292 and 293 will conveniently define the subsequent location and size of collector contact region 30 in first part 46 of surface 251, the lateral gap between STI regions 291 and 292 will conveniently define the subsequent location and size of base contact region 38 in second part 45 of surface 251, and the lateral gap to the left of STI region 291 will conveniently define the subsequent location and size of emitter region 34 in third part 44 of surface 251. Structure 903 results. For convenience of illustration, mask 50 is shown still in place in FIG. 3. As is subsequently explained, while STI regions 29 are useful, other lateral dielectric structures (e.g., "silicide" blocking layers) may be used for localizing (see FIG. 1) collector contact region 30, base contact region 38 and emitter region 34 in first part 46, second part 45 and third part 44, respectively, of surface 251.

Figure 4:
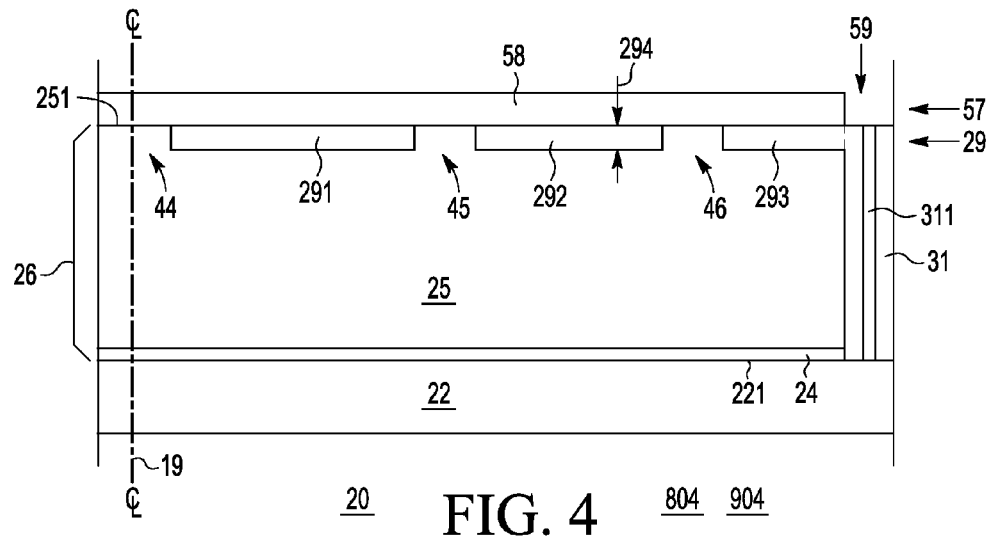

Referring now to manufacturing stage 804 of FIG. 4, if not already gone, mask 50 is removed and mask 57 is applied having closed portion 58 and open portion 59, corresponding in size and location substantially to the desired size and location of DTI region 31. DTI region 31 is formed using means well known in the art, typically by etching STI 293 and SC region 25 under opening 59 and filling it, usually with a combination of a dielectric liner (e.g., silicon oxide) and a central core 311 of polycrystalline semiconductor material (e.g., heavily dope polysilicon), although other means and arrangements may also be used. A planarization step may be included for substantially the same reasons as explained above in connection with STI regions 29. Structure 904 results. For convenience of illustration, mask 57 is shown still in place in FIG. 4. Manufacturing stages 803 and 804 may be performed in either order and preferably prior to the doping steps described later, but other manufacturing sequences may also be used in other embodiments. Where transistor 20 has a closed shape in plan view (e.g., laterally symmetric around center-line 19), DTI region 31 desirably laterally encloses transistor 20.

Figure 5:
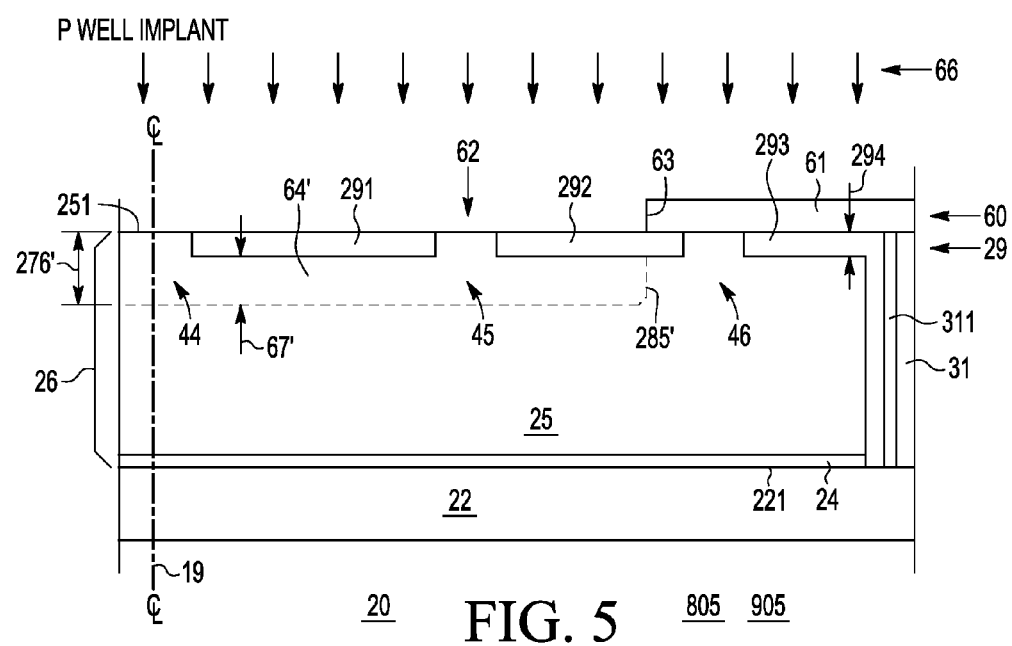

Referring now to manufacturing stage 805 of FIG. 5, if not already gone, mask 57 is desirably removed and mask 60 is applied. Mask 60 conveniently has closed portion 61 and opening 62. Closed portion 61 substantially overlies first part 46 of surface 251 indicating the desired location of collector contact region 30 of FIG. 1 and desirably has leftward edge 63 extending over STI region 292. Leftward edge 63 of closed portion 61 corresponds (within lateral diffusion tolerance) to the desired location of left edge 285 of upper portion 284 of collector region 28 (see FIG. 1). Reference number 285' is used in FIG. 5 to illustrate the approximate future location of left edge 285 of FIGS. 1 and 6.

Implant 66 is applied so that (e.g., P-WELL) doped region 64' having depth 276' below surface 251 and depth 67' below STI region 291 is formed, extending rightward to location 285' desired for subsequent left edge 285 of upper portion 284 of collector region 28 of FIGS. 1 and 6-9. The primes (') on reference numbers 64', 276', 67', etc., indicate that they are precursors to the locations or magnitudes identified by reference numbers 64, 276, 67, etc., in FIG. 1 and FIGS. 6-9. The peak impurity concentration provided by Implant 66 is usefully in the range of about 1E16 to 1E18 per $cm^3$, preferably about 5E16 per $cm^3$ or more. Stated another way, the doping profile provided by Implant 66 has its peak desirably located vertically within or close to depth 276 of FIG. 6 and falls off relatively rapidly further into doped region 25, but higher or lower doping, different positions and different tail configurations may also be used in other embodiments. By way of example and not limitation, the doping of region 64' can usefully decline to the background doping of SC region 25 at depths of 2-3 times depth 276 of FIG. 1 and FIGS. 6-9, but other tail configurations can also be used. Structure 905 results from manufacturing stage 805. The doping profile formed by Implant 66 of FIG. 5 interacts with the doping profile formed by Implant 75 of FIG. 6, and in order to obtain the desired final result for (e.g., P type) base region 64 of FIGS. 1 and 6-12, both doping profiles should be considered. This is explained in more detail in connection with manufacturing stage 806 of FIG. 6.

Figure 6:
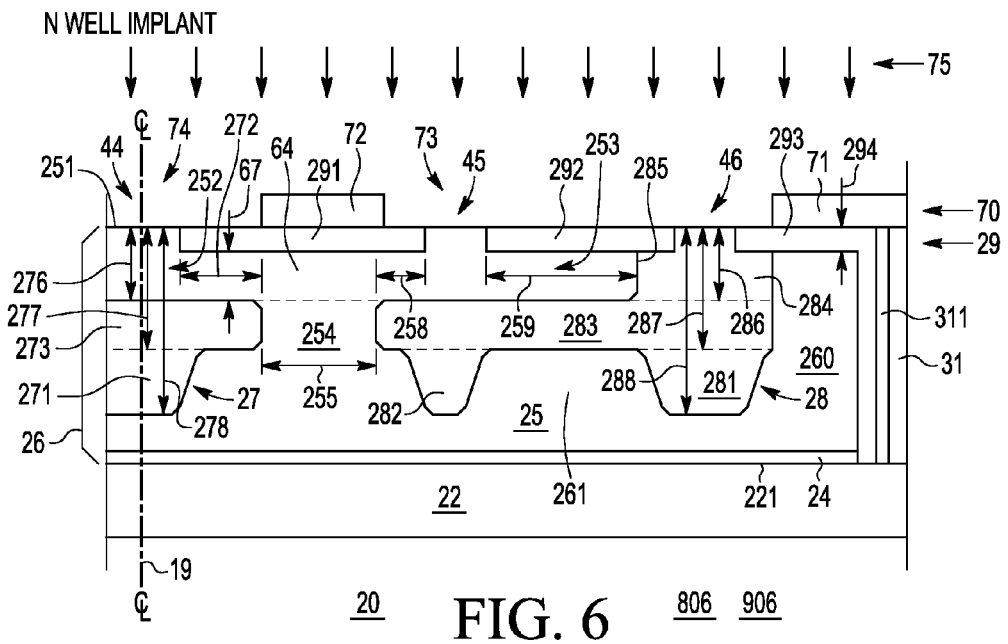

Referring now to manufacturing stage 806 of FIG. 6, mask 60 of structure 905 of FIG. 5 is removed and replaced with mask 70 having closed portions 71, 72 and openings 73, 74. Opening 73 corresponds substantially to the desired location of collector region 28 and opening 74 corresponds substantially to the desired location of floating collector region 27. The leftward edge of closed mask portion 71 substantially defines the rightward edge of collector region 28 and the rightward edge of closed portion 72 substantially defines the leftward edge of collector region 28, subject to the lateral diffusion lengths. Similarly, the leftward edge of closed portion 72 substantially defines the rightward extent of floating collector region 27. Separation distance or spacing 255 between doped regions 27 and 28 is substantially determined by the lateral width of closed portion 72. In a preferred embodiment, N-WELL Implant 75 is desirably provided through mask openings 73, 74 to simultaneously form collector region 28 and floating collector region 27. While forming collector region 28 and floating collector region 27 during the same doping step is desirable, in other embodiments, collector region 28 and floating collector region 27 may be formed in separate doping steps.

Assuming for convenience of explanation that collector regions 28, 27 are formed simultaneously, the energy and dose of Implant 75 of FIG. 6 are chosen in conjunction with the energy and dose of Implant 66 of FIG. 5, so that the near surface dose of Implant 75 is insufficient to completely counter dope region 64' formed in manufacturing stage 805 of FIG. 5, thereby providing base portion 64 (e.g., see FIG. 1) of thickness 67 below STI region 291 of the same type as SC region 25 (e.g., P type in this example) and therefore still part of the base regions of transistor 20 formed in SC region 25. It is useful to have the dopant concentration in region 64 provided by Implant 75 about half an order of magnitude less than the dopant concentration provided by implant 66 in region 64'. However, larger or smaller doping ratios can be used, provided that the net doping in region 64 remains of the same type as SC region 25. Higher implant energies and/or a chain implant are useful for providing a dopant profile for Implant 75 that is significantly deeper than the doping profile for Implant 66. Where implant 75 is not blocked by mask 70, collector region 28 and floating collector region 27 are formed in those portions of SC region 25 beneath openings 73, 74. By way of example and not limitation, where depth 294 of STI regions 29 is about 0.2-0.8 micrometers and thickness 67 is about 0.1-2.0 micrometers, then depths 288, 278 to the bottom of deeper portions 281, 282 and deeper portion 271 are usefully about 1.0-8.0 micrometers, and depths 287, 277 to the bottom of central portions 283, 273 are usefully about 0.5-6.0 micrometers, but other depths may also be used. The vertical extents of deeper portions 281, 282 and deeper portion 271 are therefore the differences between depths 288, 287 and between depths 278, 277, respectively. While having depth pairs 286, 276; 287, 277; and 288, 278 is convenient, in other embodiments, they may have different magnitudes. Base region 64 formed in manufacturing stage 806 of FIG. 6, has leftward portion 252 and rightward portion 253. As illustrated in FIG. 1, leftward portion 252 lies between emitter region 34 (and in this embodiment a portion of STI region 291) and floating collector region 27. In this embodiment, rightward portion 253 lies between base contact region 38 (including a portion of STI regions 291, and 292) and collector region 28. In various embodiments illustrated, for example, in FIGS. 6 and 10-11, the leftward edge of central portion 283 may underlie STI region 291, may underlie base contact region 38 or may underlie STI region 292.

Collector region 28 forms beneath opening 73 and floating collector region 27 forms beneath opening 74. Deeper portions 281, 282 of collector region 28 correspond substantially to the location of the gaps between STI regions 291-293 and deeper portion 271 of floating collector region 27 corresponds substantially to the location of the gap at the left of STI region 291. Deeper portion 281 substantially underlies first part 46 of surface 251, deeper portion 282 substantially underlies second part 45 of surface 251 and deeper portion 271 substantially underlies third part 44 of surface 251. Where the implanted ions pass directly into SC region 25 and are not impeded by STI regions 29, they penetrate deeper into SC region 25, thereby giving rise to deeper portions 281, 282 of collector region 28 and deeper portion 271 of floating collector region 27, but such deeper portions may be omitted in other embodiments. Rightward lateral edge 285' (see FIG. 5) of Implant 66 resulting in doped region 64' of FIG. 5, substantially defines leftward extent 285 of wider (upper) portion 284 of collector region 28. In this embodiment, central portion 283 of collector region 28 extends laterally between and slightly beyond deeper portions 281, 282, the lateral extent of central region 283 being substantially determined by the width of mask opening 73 of FIG. 6. Lateral width 259 by which rightward portion 253 of base region 64 extends between base contact location 45 and leftward edge 285 of upper portion 284 of collector region 28 is usefully at least about 0.25 micrometers and more conveniently in the range of about 1 micrometer or more, but larger and smaller widths may also be used. Similarly, central portion 273 of floating collector region 27 extends laterally above and beyond deeper portion 271, and has its lateral extent determined by mask opening 74. Distance 272 between the left edge of STI region 291 and the left edge of mask portion 72 substantially determines the amount 272 by which central portion 273 of floating collector 27 extends laterally toward central portion 283 of collector 28 from the eventual lateral location of emitter region 34 (e.g. see FIGS. 1 and 7). It is desirable that distance 272 (see FIG. 6) be greater than zero, more usefully at least about 0.1 micrometers and more conveniently at least about 0.25 micrometers, but larger or smaller values may also be used. It is desirable that width 255 of (e.g., P type) portion 254 of SC region 25 between (e.g., N type) regions 27, 28 not be too small. Width 255 is usefully in the range of about 0.1 to 5.0 micrometers and preferably in the range of about 0.5 to 3.0 micrometers, but larger or smaller separation widths 255 may also be used. With respect to the various depths, by way of example and not limitation, where thickness 294 of STI regions 29 is about 0.4 micrometers and thickness 67 of (e.g., P type) region 64 is about 0.5 micrometers, depth 286 from surface 251 to the top of (e.g., N type) central portions 273, 283 is about 0.9 micrometer, and depth 277, 287 from surface 251 to the bottom of central (e.g., N type) portions 273, 283 is about 2.5 micrometers, then depth 278, 288 to the bottom of (e.g., N type) deeper portions 271, 281, 282 is about 3.5 micrometers, but other depths and different depths may also be used in other embodiments. Structure 906 results from manufacturing stage 806. While it is convenient to have each pair of depths 286, 276 and depths 287, 277 and depths 288, 278 be substantially the same, in other embodiments, they may be different and deeper portions 271, 281, 282 may be omitted in still other embodiments.

Figure 7:
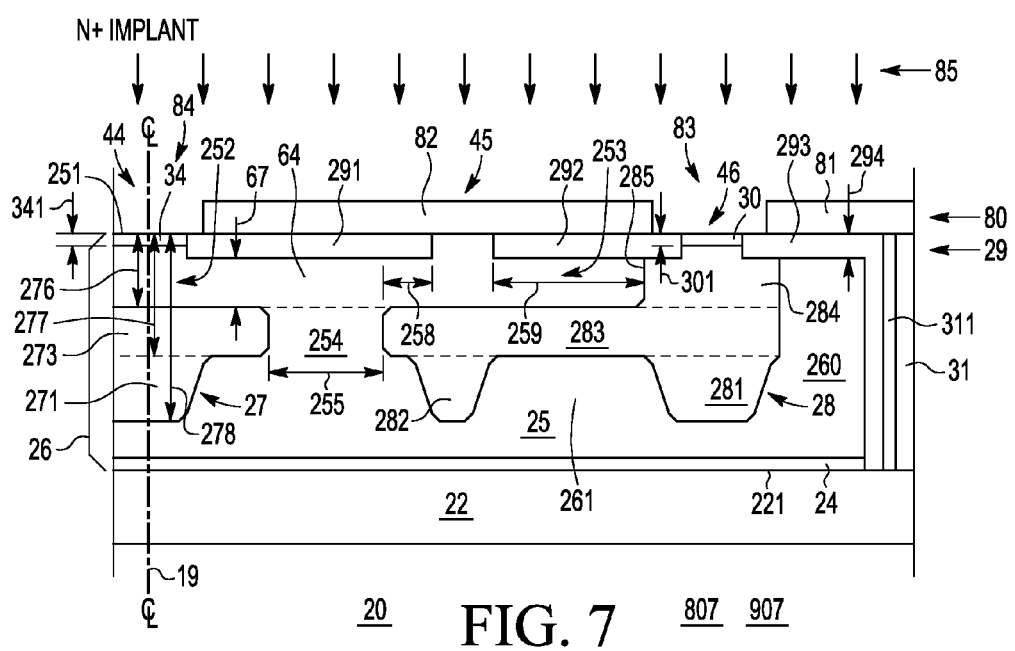

Referring now to manufacturing stage 807 of FIG. 7, mask 70 is stripped and mask 80 applied having closed portions 81, 82 and openings 83, 84. Openings 83, 84 include first part 46 and third part 44 of surface 251, respectively. Implant 85 (e.g., N+) is provided through openings 83. 84. Collector (e.g., N+) contact region 30 of depth 301 is provided through mask opening 83 in first part 46 of surface 251 and (e.g., N+) emitter region 34 of depth 341 is provided through opening 84 in third part 44 of surface 251. Depths 301, 341 are usefully in the range of about 0.02 to 0.4 micrometers, but other depths may also be used. While it is convenient to form collector contact region 30 and emitter region 34 at the same time, separate doping steps may be used in other embodiments. Mask portion 82 blocks Implant 85 from reaching the location in second part 45 of surface 251 where base contact region 38 of FIGS. 1 and 8 will be subsequently located. Structure 907 results from manufacturing stage 807.

Figure 8:
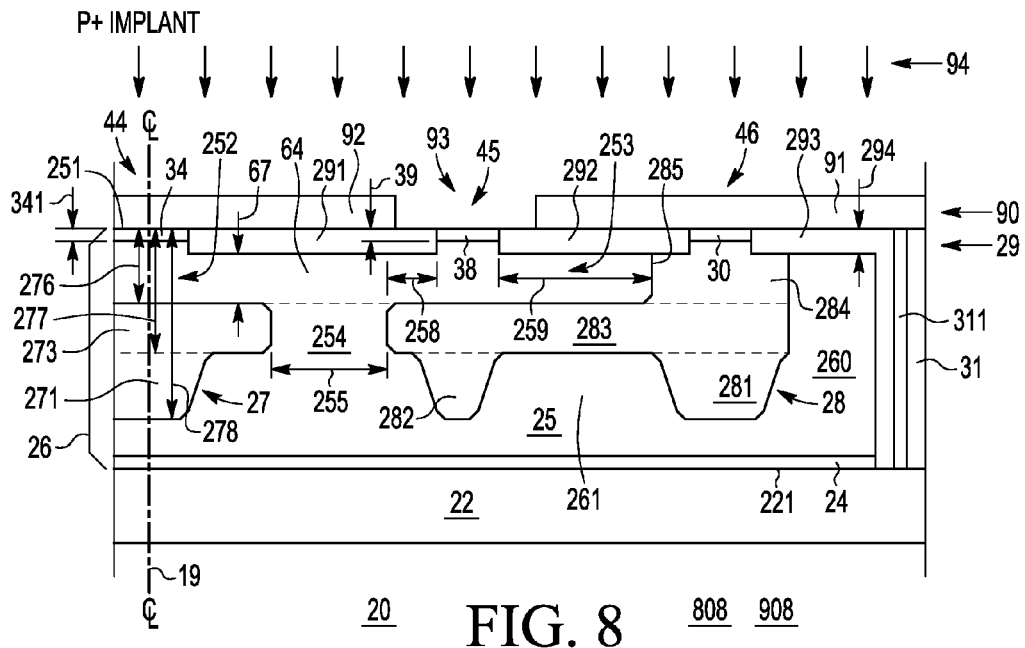

Referring now to manufacturing stage 808 of FIG. 8, mask 80 is stripped and mask 90 applied, having closed portions 91, 92 and opening 93. Implant 94 (e.g., P+) is provided through opening 93. Base contact (e.g., P+) region 38 of depth 39 is formed through mask opening 93 in second part 45 of surface 251. Depth 39 and doping of base contact region 38 should be sufficient to provide a relatively low resistance Ohmic contact to portion 253 of base region 64 that forms part of the base region 64 of transistor 20. By way of example and not limitation, depth 39 is usefully in the range of about 0.02 to 0.4 micrometers, but other depths may also be used. Closed portions 91 and 92 of mask 90 prevent Implant 94 from affecting other portions of transistor 20. Structure 908 results from manufacturing stage 808.

Figure 9:
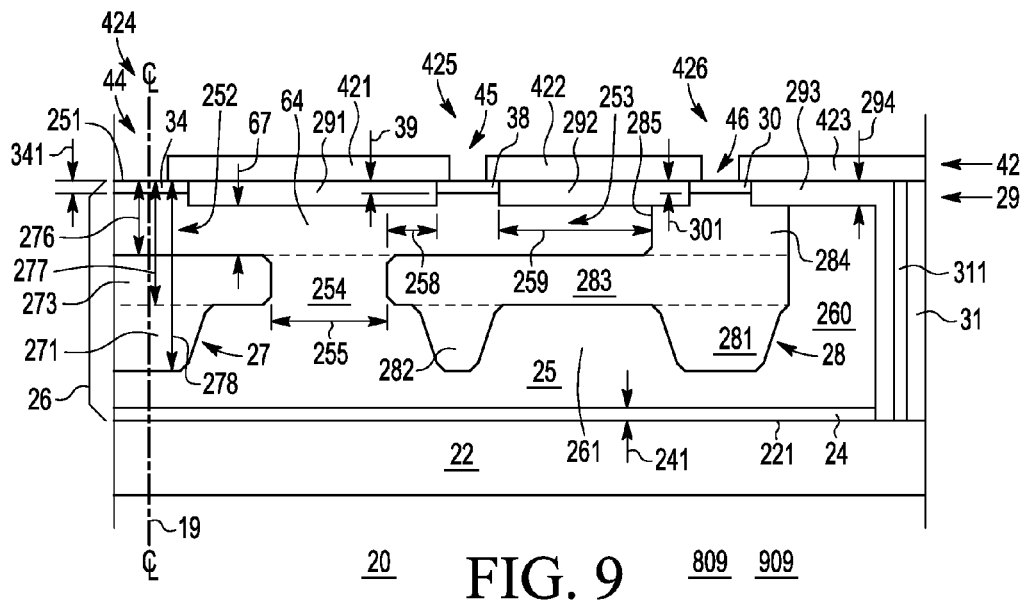

Referring now to manufacturing stage 809 of FIG. 9, mask 90 is stripped and optional dielectric layer 42 having closed portions 421, 422, 423 and openings 424, 425, 426 is provided. Silicon oxide is a non-limiting example of a suitable material for dielectric layer 42, but other insulating materials may also be used. Emitter region 34 is exposed in opening 424 over third part 44 of surface 251, base contact region 38 is exposed in opening 425 over second part 45 of surface 251 and collector contact region 30 is exposed in openings 426 over first part 46 of surface 251 of device 20. Structure 909 results. Referring now to FIG. 1, emitter electrode 36, base electrode 40 and collector electrode 32 are applied to structure 909, using means well known in the art, to provide the arrangement illustrated in FIG. 1. Emitter terminal 37, base terminal 41 and collector terminal 33 may be provided to facilitate connection of transistor electrodes 36, 40, 32 (see FIG. 1) to other elements that may be part of the same IC. Such "back-end" steps are well known in the art. Transistor 20 of FIG. 1 results.

Figure 10:
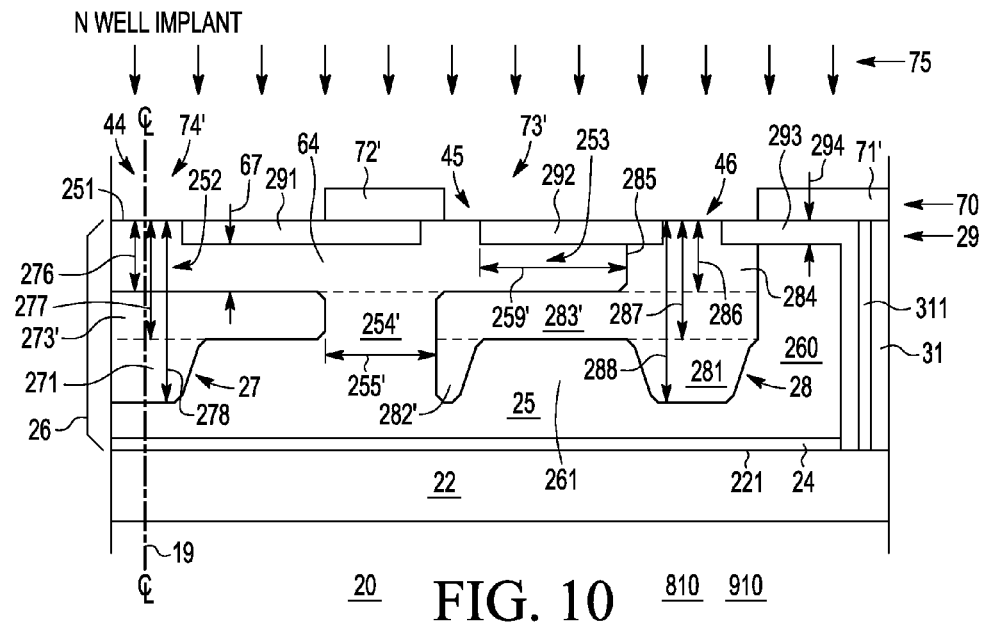
FIGS. 10-11 show simplified cross-sectional views of the bipolar transistor of FIG. 1 according to still yet further embodiments of the invention.
Figure 11:
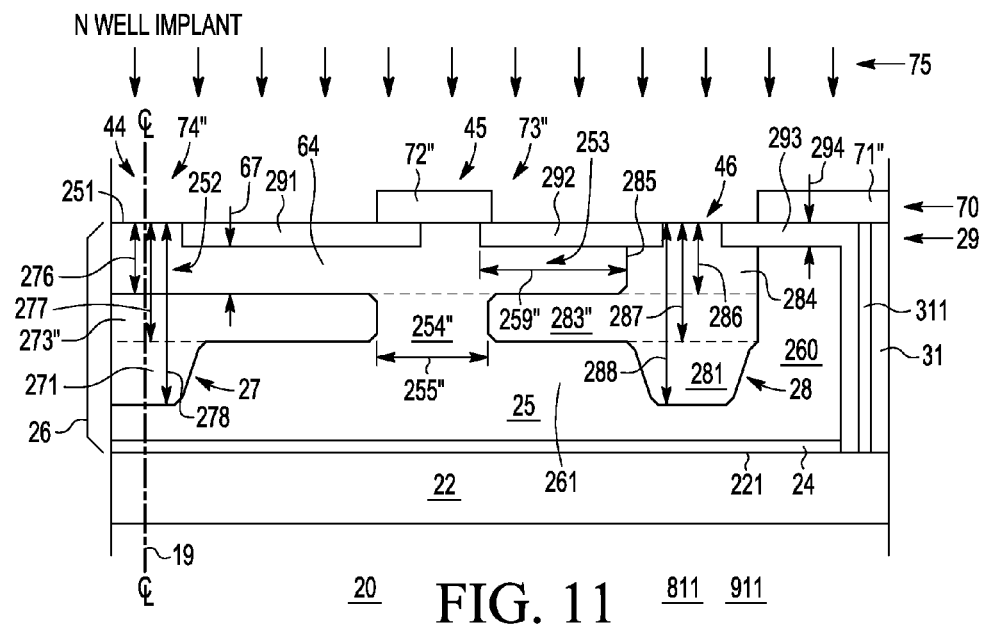

FIGS. 10-11 show simplified cross-sectional views of bipolar transistor 20 of FIG. 1, according to still yet further embodiments of the invention. Manufacturing stages 810 and 811 of FIGS. 10-11 are analogous to manufacturing stage 806 of FIG. 6, wherein (e.g., N-well) implant 75 is being provided to form collector region 28 and floating collector region 27, and the discussion thereof associated with FIG. 6 is incorporated herein by reference. Closed portion 72, 72', 72" of mask 70 (see FIGS. 6 and 10-11) for Implant 75 determines the location of the leftward edge of collector region 283, 283', 283" and the rightward edge of floating collector 273, 273', 273" and separation 255, 255', 255" therebetween. It is very desirably to be able to independently determine the lateral location and separation of such collector edges. This is illustrated in manufacturing stages 806 and 810-811 of FIGS. 6 and 10-11, respectively.

In manufacturing stage 806 of FIG. 6, mask 72 is located so that the leftward edge of collector region 283 underlies STI region 291. Lateral width 255 of base region 254 between collector region 28 and floating collector region 27 is substantially determined by the lateral width of mask portion 72. For convenience of description and to avoid cluttering the drawings, it is assumed in connection with FIGS. 10 and 11 that the magnitude of lateral width 255', 255" of (e.g., P type) region 254', 254" is the same in FIGS. 10-11 as for width 255 and region 254 of FIG. 6, but lateral width or distance 255, 255', 255" may be different in other embodiments. FIGS. 6 and 10-11 illustrate circumstances in which the lateral position of mask 72, 72', 72" is altered so that the leftward edge of collector portion 283, 283', 283" is in different lateral locations with respect to the eventual location of base contact 30 subsequently formed in second part 45 of surface 251 between STI regions 291 and 292. As noted above, in FIG. 6, mask portion 72 is positioned so that the leftward edge of collector portion 283 underlies STI region 291 to the left of second part 45 of surface 251 where base contact region 38 will be subsequently formed. In FIG. 10, mask portion 72' is positioned so that the leftward edge of collector portion 283' substantially underlies second part 45 of surface 251 between STI regions 291, 292 where base contact 30 will be subsequently formed. In FIG. 11, mask portion 72" is positioned so that the leftward edge of collector portion 283" substantially underlies STI region 292 to the right of second part 45 of surface 251 where base contact 30 will be subsequently be formed. Thus, by altering the location of mask portions 72, 72', 72" the leftward extent of collector portion 283, 283' 283" may be varied. Similarly, by adjusting the width of mask portions 72, 72', 72" the rightward edge of floating collector portion 273, 273', 273" and separation distance 255, 255', 255" of (e.g., P type portions 254, 254', 254" of SC region 25 between collector portions 273, 273', 273" and 283, 283', 283" may be independently determined with respect to the location of eventual base contact 30 (e.g., see FIG. 1). Thus, the disclosed manufacturing method provides great design flexibility.

Figure 12:
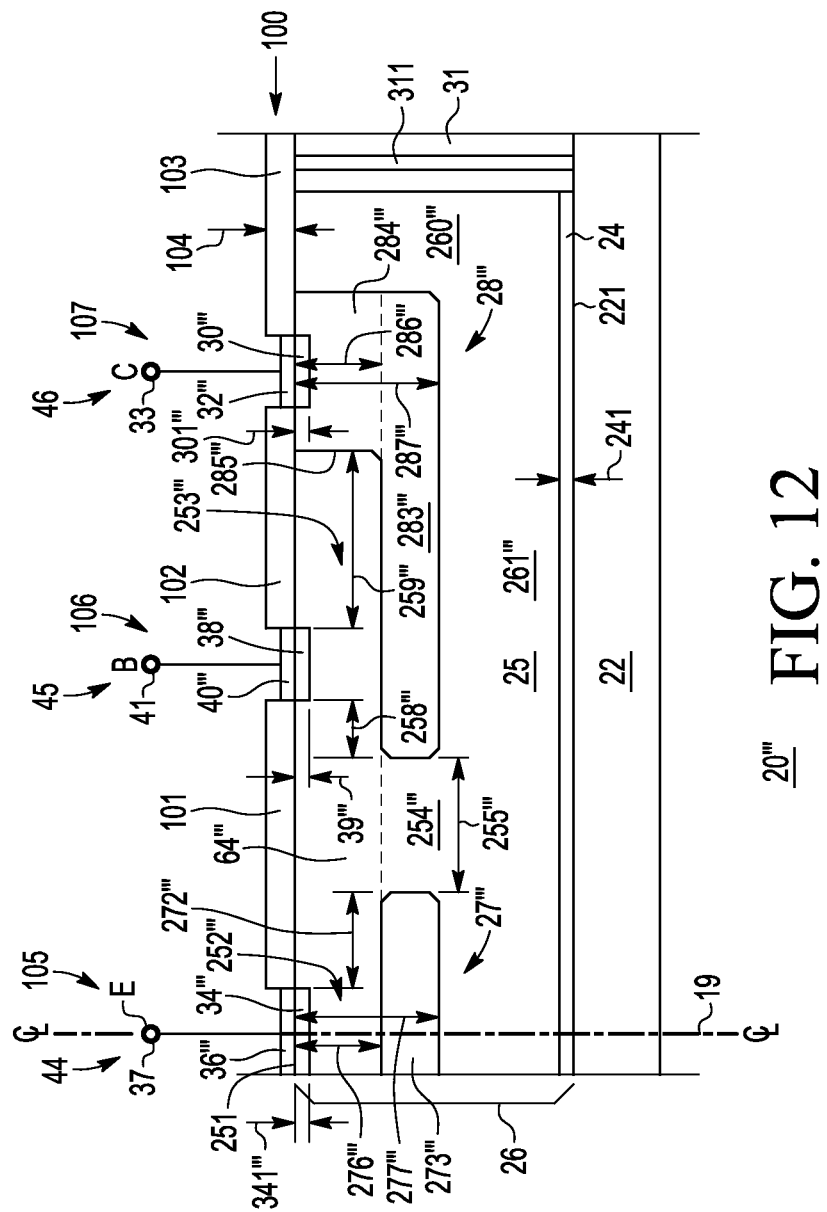
FIG. 12 shows a simplified cross-sectional view about a centerline of an improved bipolar transistor according to another embodiment of the invention.

FIG. 12 shows a simplified cross-sectional view about centerline 19 of improved bipolar transistor 20''' according to another embodiment of the invention. (It will be understood that in FIGS. 1-14, only the rightward half of device 20, 20''' is shown and that the leftward half (not shown) is mirror image symmetric about centerline 19.) The convention is adopted of generally identifying various device elements or regions analogous to those of FIGS. 1-11 by the same reference numbers but with a triple prime (''') added to indicate that they may differ in detail. Unless otherwise specifically noted, the discussion in connection with FIGS. 1-11 with respect to such like-reference-numbered elements with or without prime (') or double primes (") is incorporated herein by reference. Bipolar transistor 20''' differs from bipolar transistor 20 in that STI regions 29 are not present in device 20'''. Instead insulating blocking layer 100 of thickness 104 is provided on surface 251 of SC region 25. Blocking layer 100 has closed portions 101, 102, 103 and openings or gaps 105, 106, 107. Closed portions 101, 102, 103 locally inhibit formation of SC-metal alloy contacts on surface 251 of SC region 25, except over SC regions 34''', 38''', 30''' (analogous to regions 34, 38, 30 of FIGS. 1-11) exposed in openings or gaps 105, 106, 107 of blocking layer 100. Silicon oxide, silicon nitride and combinations thereof are non-limiting examples of suitable materials for blocking layer 100. In practice, when an alloying metal is deposited over surface 251 of device 20, 20''' in order to form (e.g., see FIGS. 1 and 12) Ohmic connection 32, 32''' to collector contact region 30, 30''' in first part 46 of surface 251, to form Ohmic connection 40, 40''' to base contact region 38, 38''' in second part 45 of surface 251 and to form Ohmic connection 36, 36''' to emitter region 34, 34''' in third part 44 of surface 251, the presence of closed portions 101, 102, 103 of blocking layer 100 (see FIG. 12) prevent such SC-metal alloy from forming except on those parts 44, 45, 46 of SC surface 251 exposed in gaps 105, 106, 107. Any unalloyed metal located elsewhere is removed by a brief etch, leaving behind SC-metal connections 36''', 40''', 32''' of FIG. 12 to emitter region 34''', base contact region 38''' and collector contact region 30''', which are substantially equivalent in function to SC-metal connections 36, 40, 32 to emitter region 34, base contact region 38 and collector contact region 30 of FIG. 1.

Where SC region 25 is of silicon, blocking layer 100 is commonly referred to as a "silicide blocking layer", since the SC-metal alloy formed under openings 105, 106, 107 comprises silicides. While the term "silicide" refers specifically to metal-silicon alloys, as used herein, the term "silicide" is intended to refer to any SC-metal alloy, for example, as may be formed when the exposed contact regions comprise semiconductors other than plain silicon, and is not limited just those formed on silicon semiconductors. Accordingly, for convenience of description, blocking layer 100 may also be referred to as "silicide blocking" layer 100 even though non-silicon-metal alloys may be involved depending on the SC used for SC region 25. Closed portions 101, 102, 103 of blocking layer 100 are also referred to as lateral insulating structures 101, 102, 103, collectively lateral insulating structures 100.

Silicide block layer 100 has closed portion 101 approximately in the same location as STI region 291, closed portion 102 approximately in the same location as STI region 292 and closed portion 103 approximately in the same location as STI region 293 of FIGS. 1-11. Opening 105 in blocking layer 100 to the left of closed portion 101 corresponds to the location of emitter region 34''' in third part 44 of surface 251. Opening 106 between portions 101 and 102 correspond to the location of base contact region 38''' in second part 45 of surface 251 and opening 107 between closed portions 102 and 103 corresponds to the location of collector contact region 30''' in first part 45 of surface 251. Thickness 104 of blocking layer 100 is desirably large enough to act as a mask during the equivalent of manufacturing stages 807 of FIG. 7 in which emitter region 34 and collector contact region 30 were formed and during manufacturing stage 808 of FIG. 8 in which base contact region 38 was formed. With respect to laterally localizing the formation of metal-SC connections to emitter region 34''', base contact region 38''' and collector contact region 30''', lateral insulating structures 100 of FIG. 12 and lateral insulating structures 29 of FIGS. 1 and 4-9 perform analogous functions. Accordingly, STI regions 291, 292, 293 are referred to as "first" lateral insulating structures 29 and blocking regions 101, 102, 103 are referred to as "second" lateral insulating structures 100 and the term "lateral insulating structures" 29, 100 is intended to refer to them collectively.

Figure 13:
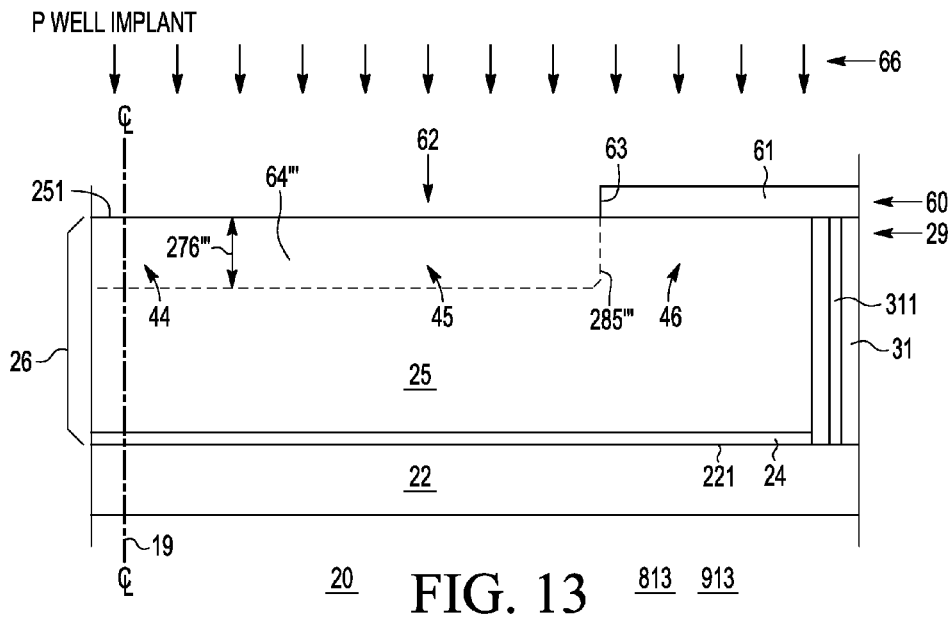
FIGS. 13-14 show simplified cross-sectional views of the bipolar transistor of FIG. 12 during various stages of manufacture according to still other embodiments of the invention.
Figure 14:
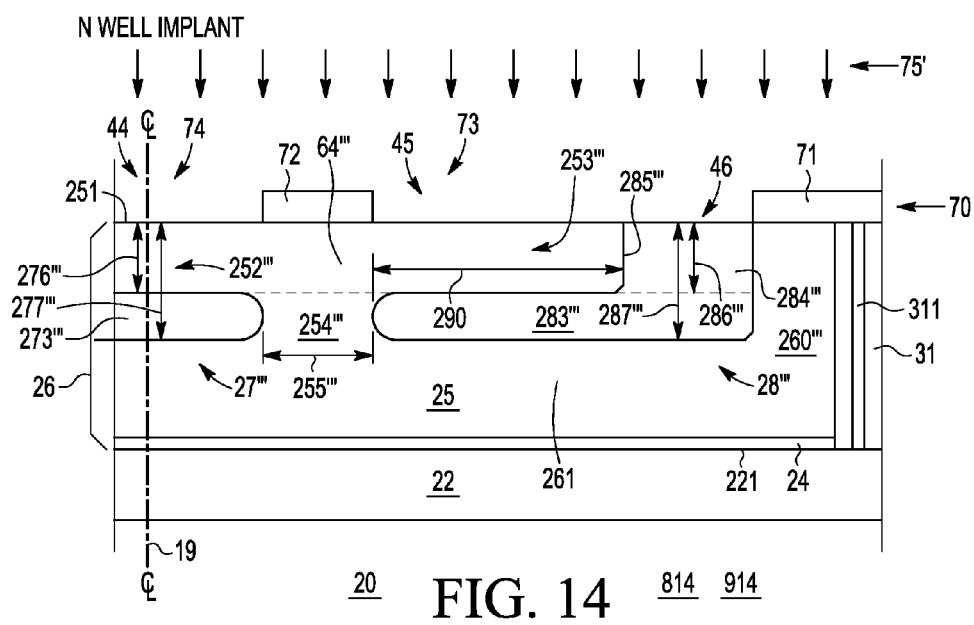

Another difference between transistor 20''' of FIG. 12 and transistor 20 of FIGS. 1-11 is that deep collector regions 281, 282, 271 are not present in transistor 20'''. This is a consequence of the way in which transistor 20''' is formed. FIGS. 13-14 show simplified cross-sectional views of bipolar transistor 20''' of FIG. 12 during manufacturing stages 813 and 814, yielding structures 913, 914, according to still other embodiments of the invention. Manufacturing stage 813 of FIG. 13 is the functional equivalent of manufacturing stage 805 of FIG. 5, except that STI regions 29 are not present. P-well Implant 66 is provided through opening 62 of mask 60 in substantially the same manner as already described, thereby forming doped region 64''' of depth 276''' beneath surface 251 underneath opening 62. Locations or parts 44, 45, 46 of SC surface 251 are equivalent to locations or parts 44, 45, 46 of SC surface 251 already described. Boundary 285''' of doped region 64''' is substantially determined, as before, by left edge 63 of mask 60. Structure 913 results, the functional equivalent of structure 905 of FIG. 5 but without STI regions 29.

Referring now to manufacturing stage 814 of FIG. 14, mask 60 is removed from structure 913 and mask 70 provided over surface 251. Mask 70 has closed portions 71, 72 and open portions 73, 74 equivalent to the like numbered regions or elements shown in manufacturing stage 806 of FIG. 6, and performing an analogous function. In manufacturing stage 814, N-well Implant 75 is provided in an analogous manner to that already described for Implant 75 of manufacturing stage 806 or FIG. 6, thereby forming collector region 28''' and floating collector region 27'''. In the embodiment of FIGS. 13-14, collector regions 28''', 27''' are formed, substantially similar to collector regions 28, 27. Depths 287''' and 277''' may be somewhat deeper than corresponding depths 287, 277 of FIG. 1, and downward extensions 281, 282, 271 are not formed. In the exemplary embodiment of FIG. 12-14, base region 253''' extends for distance 290 (see FIG. 14) over collector portion 283''' from the leftward edge of collector portion 283''' to leftward edge 285''' of collector portion 284'''. Structure 914 results. Persons of skill in the art will understand based on the description herein, that the position and size of mask portions 71, 72 and openings 73, 74 of FIG. 14 may be adjusted in substantially the same manner as illustrated for mask portions 71', 71''; 72', 72'' and openings 73', 73''; 74', 74'' of FIGS. 10-11 to vary the location and separation of collector regions 28''', 27''' in the same manners as those of collector regions 28, 27 of FIGS. 9-10 are varied. This provides a valuable degree of design flexibility.

In FIGS. 1-11, device 20 was formed using STI regions 29 for defining the lateral separations of collector contact region 30 in first part 46 of surface 251, base contact region 38 in second part 45 of surface 251 and emitter region 34 in third part 44 of surface 251. In FIG. 12, device 20''' was formed using silicide blocking regions 100 for defining the lateral separations of collector contact region 30''' in first part 46 of surface 251, base contact region 38''' in second part 45 of surface 251 and emitter region 34''' in third part 44 of surface 251. STI regions 29 and silicide blocking regions 100 are referred to collectively as lateral insulating structures 29, 100. In the depicted embodiments, a single type of lateral insulating structure (e.g., 29 or 100) is used for establishing all such separations. However in other embodiments, a mixture of such arrangements may be used. For example, and not intended to be limiting, the separation of the emitter region 34, 34''' and the base contact region 38, 38''' may be determined by one type of lateral insulating structure (e.g., either 29 or 100) and the separation between base contact region 38, 38''' and collector contact region 30, 30''' may be determined by another type of insulating structure, (e.g., either 100 or 29). Accordingly, a single type of lateral insulating structure need not be used throughout, and they may be mixed and matched as desired by the designer. Thus, the invented method and structure possess great flexibility.

In the sections that follow and in the claims where included, any reference numbers that are mentioned as simple integers and without primes (e.g., without ('), (''), and/or (''')) are to be interpreted as including such variations. According to a first embodiment, there is provided a bipolar transistor (20), comprising, a first semiconductor (SC) region (25) of a first conductivity type, having an upper surface (251), and having therein a base region (64) of the first conductivity type, an emitter region (34) of a second, opposite, conductivity type, a base contact region (38) of the first conductivity type laterally separated from the emitter region (34) and a collector contact region (30) of the second conductivity type laterally separated from the base contact region (38), a collector region (28) of the second conductivity type coupled to the collector contact region (30), and a floating collector region (27) of the second conductivity type laterally spaced apart from the collector region (28) and at least partly underlying the emitter region (34). According to a further embodiment, a central portion (273) of the floating collector region (27) underlies and is vertically separated from the emitter (34) by a first portion (252) of the base region (64). According to a still further embodiment, the central portion (273) of the floating collector region (27) extends laterally from a location directly under the emitter (34) toward the collector region (28) by a first distance (272) greater than zero. According to a yet further embodiment, first distance (272) is at least about 0.1 micrometers. According to a still yet further embodiment, the collector region (28) and the floating collector region (27) are laterally separated by a further portion (254) of the first SC region (25) communicating with the base region (64), wherein the further portion (254) of the first SC region (25) has a first lateral width (255). According to a yet still further embodiment, first lateral width (255) is at least about 0.1 micrometers. According to another embodiment, a central portion (283) of the collector region (28) is vertically separated from the base contact region (38) by a second portion (253) of the base region (64). According to a still another embodiment, the second portion (253) of the base region (64) extends laterally from the base contact (38) toward an upper portion (284) of the collector region (28) by a second distance (259) of at least about 0.25 micrometers. According to a yet another embodiment, the floating collector region (27) is substantially enclosed by first sub-portions (252, 254, 261) of the first SC region (25). According to a still yet another embodiment, the collector region (28) is substantially laterally surrounded by second sub-portions (253, 260, 261, 254) of the first SC region (25). According to a yet still another embodiment, the bipolar transistor further comprises an insulating layer (24) underlying the first SC region (25). According a further another embodiment, the bipolar transistor (20) additionally comprises lateral insulating structures (29, 100) proximate the upper surface (251) and laterally separating the emitter region (34), the base contact region (38), and the collector contact region (30).

According to a second embodiment, there is provided a method for forming a bipolar transistor (20), comprising, providing a substrate (22) having a first SC region (25) of a first conductivity type, forming in the first SC region (25), a collector region (28) of a second opposite conductivity type and a floating collector region (27) of a second opposite conductivity type, wherein the collector region (28) and the floating collector region (27) are spaced apart by a first lateral distance (254), forming in the first SC region (25), an emitter region (34) of the second conductivity type vertically separated from and at least in part overlying the floating collector region (27), and forming a collector contact region (30) of the second conductivity type coupled to the collector region (28) and laterally separated from the emitter region (34), and forming in the first SC region (25), a base contact region (38) of the first conductivity type vertically separated from the collector region (28) and laterally separated from the emitter region (34). According to a further embodiment, the step of forming laterally separated emitter region (34) and base contact region (38) is performed using a first lateral insulating structure (291, 101) and the step of forming laterally separated base contact region (38) and collector contact region (30) is performed using a second lateral insulating structure (292, 102). According to a still further embodiment, the step of forming laterally separated emitter region (34), base contact region (38) and collector region (30) comprises forming the first lateral insulating structure (291, 101) and the second lateral insulating structure (292, 102) as either: (i) both shallow trench isolation (STI) regions (291, 292), or (ii) both SC-metal-alloy blocking (SC-MAB) regions (101, 102), or (iii) a combination thereof wherein if the first lateral insulating structure (291, 101) is an STI region (291) then the second lateral insulating structure (292,102) is an SC-MAB region (102), or if the first lateral insulating structure (291, 101) is an SC-MAB region (102), then second lateral insulating structure (292,102) is an STI region (291). According to a yet further embodiment, the method further comprises forming a base region (64) of the first conductivity type having a first portion (252) lying between the emitter region (34) and the floating collector region (27) and a second portion (253) extending laterally over a part of the collector region (28) and another portion (254) of the first SC region (25) between the collector region (28) and the floating collector region (27). According to a still yet further embodiment, forming the base region (64) comprises, in either order, doping a shallower portion (64) of the first SC region (25) with an impurity of the first conductivity type and forming the collector region (28) and floating collector region (27) by doping portions of the first SC region (25) with an impurity of the second conductivity type.

According to a third embodiment, there is provided a bipolar transistor (20), comprising, a first semiconductor (SC) region (25) of a first conductivity type, having an upper surface (251) and having therein an emitter region (34), a base contact region (38) and a collector contact region (30), a second SC region (27) of a second, opposite, conductivity type in the first SC region (25) underlying but vertically separated from the emitter region (34) by a first part (252) of the first SC region (25), the second SC region (27) having a central portion (273) extending laterally toward but not to the base contact region (38), and a third SC region (28) of the second conductivity type in the first SC region (25), wherein the second SC region (28) has a first portion (284) underlying and Ohmically coupled to the collector contact region (30) and a second portion (283) Ohmically coupled to the first portion (284) of the third SC region (28) and separated in part from the upper surface (251) at least by a second part (253) of the first SC region (25) that is Ohmically coupled to the base contact region (38), and wherein the third SC region (28) is laterally separated from the second SC region (27) by a third part (254) of the first SC region (25). According to a further embodiment, the third SC region (28) is substantially laterally surrounded by first sub-portions (253, 254, 260, 261) of the first SC region (25). According to a still further embodiment, the second SC region (27) is substantially surrounded by second sub-portions (252, 254, 261) of the first SC region (25).

While at least one exemplary embodiment and method of fabrication has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A bipolar transistor, comprising:
    a first semiconductor (SC) region of a first conductivity type, having an upper surface, and having therein a base region of the first conductivity type, an emitter region of a second, opposite, conductivity type, a base contact region of the first conductivity type laterally separated from the emitter region and a collector contact region of the second conductivity type laterally separated from the base contact region;
    a collector region of the second conductivity type coupled to the collector contact region; and
    a floating collector region of the second conductivity type laterally spaced apart from the collector region and at least partly underlying the emitter region;
    wherein entirety of the floating collector region is laterally separated from the entirety of the collector region as taken along an axis parallel to the upper surface of the first SC region.

2. The bipolar transistor of claim 1, wherein a central portion of the floating collector region underlies and is vertically separated from the emitter region by a first portion of the base region.

3. The bipolar transistor of claim 2, wherein the central portion of the floating collector region extends laterally from a location directly under the emitter toward the collector region by a first distance greater than zero.

4. The bipolar transistor of claim 3, wherein first distance is at least about 0.1 micrometers.

5. The bipolar transistor of claim 1, wherein the collector region and the floating collector region are laterally spaced separated by a further portion of the first SC region communicating with the base region, wherein the further portion of the first SC region (25) has a first lateral width.

6. The bipolar transistor of claim 5, wherein the first lateral width is at least about 0.1 micrometers.

7. The bipolar transistor of claim 1, wherein a central portion of the collector region is vertically separated from the base contact region by a second portion of the base region.

8. The bipolar transistor of claim 7, wherein the second portion of the base region extends from the base contact toward an upper portion of the collector region by a second distance of at least about 0.25 micrometers.

9. The bipolar transistor of claim 1, wherein the floating collector region is substantially enclosed by first sub-portions of the first SC region.

10. The bipolar transistor of claim 9, wherein the collector region is substantially laterally surrounded by second sub-portions of the first SC region.

11. The bipolar transistor of claim 1, further comprising an insulating layer underlying the first SC region.

12. The bipolar transistor of claim 1, further comprising lateral insulating structures proximate the upper surface and laterally separating the emitter region, the base contact region, and the collector contact region.

13. A method for forming a bipolar transistor, comprising:
providing a substrate having a first SC region of a first conductivity type;
forming in the first SC region, spaced-apart collector region and floating collector region of a second opposite conductivity type, the entirety of the spaced-apart collector region and the entirety of the floating collector region laterally separated by an intervening portion of the first SC region as taken along an axis parallel to an upper surface of the first SC region;
forming in the first SC region, an emitter region of the second conductivity type vertically separated from and at least in part overlying the floating collector region, and forming a collector contact region of the second conductivity type coupled to the collector region and laterally separated from the emitter region; and
forming in the first SC region, a base contact region of the first conductivity type vertically separated from the collector region, overlying the collector region, and laterally separated from the emitter region.

14. The method of claim 13, wherein the step of forming laterally separated emitter region and base contact region is performed using a first lateral insulating structure and the step of forming laterally separated base contact region and collector contact region is performed using a second lateral insulating structure.

15. The method of claim 14, wherein the step of forming laterally separated emitter region, base contact region and collector region comprises forming the first lateral insulating structure and the second lateral insulating structure as either: (i) both shallow trench isolation (STI) regions, or (ii) both SC-metal alloy blocking (SC-MAB) regions, or (iii) a combination thereof wherein if the first lateral insulating structure is an STI region then the second lateral insulating structure is an SC-MAB region, or if the first lateral insulating structure is an SC-MAB region, then second lateral insulating structure is an STI region.

16. The method of claim 13, further comprising forming a base region of the first conductivity type having a first portion lying between the emitter region and the floating collector region and a second portion extending laterally over a part of the collector region and the intervening portion of the first SC region.

17. The method of claim 16, wherein forming the base region comprises, in either order, doping a shallower portion of the first SC region with an impurity of the first conductivity type and forming the collector region and floating collector region by doping portions of the first SC region with an impurity of the second conductivity type.

18. A bipolar transistor, comprising:
a first semiconductor (SC) region of a first conductivity type, having an upper surface and having therein an emitter region, a base contact region and a collector contact region;
a second SC region of a second, opposite, conductivity type in the first SC region underlying but vertically separated from the emitter region by a first part of the first SC region, the second SC region having a central portion extending laterally toward but not to the base contact region; and
a third SC region the second conductivity type in the first SC region, wherein the second SC region has a first portion underlying and Ohmically coupled to the collector contact region and a second portion Ohmically coupled to the first portion of the third SC region and separated in part from the upper surface at least by a second part of the first SC region that is Ohmically coupled to the base contact region, and wherein the entirety of the third SC region is laterally separated from the entirety of the second SC region by a third part of the first SC region as taken along an axis parallel to the upper surface of the first SC region.

19. The bipolar transistor of claim 18, wherein the third SC region is substantially laterally surrounded by first sub-portions of the first SC region.

20. The bipolar transistor of claim 18, wherein the second SC region is substantially surrounded by second sub-portions of the first SC region.

* * * * *